(12) United States Patent
Sheridan et al.

(10) Patent No.: US 7,190,062 B1
(45) Date of Patent: Mar. 13, 2007

(54) EMBEDDED LEADFRAME SEMICONDUCTOR PACKAGE

(75) Inventors: Richard Peter Sheridan, Gilbert, AZ (US); Ronald Patrick Huemoeller, Chandler, AZ (US); David Jon Hiner, Chandler, AZ (US); Sukianto Rusli, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 200 days.

(21) Appl. No.: 10/868,244

(22) Filed: Jun. 15, 2004

(51) Int. Cl.
*H01L 23/02* (2006.01)

(52) U.S. Cl. .................. 257/686; 438/109; 257/713; 257/666

(58) Field of Classification Search ............. 257/678, 257/668, 690, 723, 724
See application file for complete search history.

(56) References Cited

U.S. PATENT DOCUMENTS

| | | |
|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |

(Continued)

FOREIGN PATENT DOCUMENTS

DE 19734794 A1 8/1997

(Continued)

OTHER PUBLICATIONS

Laplante, Phillip Comprehensive Dictionary of Electrical Engineering, 1999, CRC Press, p. 363.*

*Primary Examiner*—Evan Pert
*Assistant Examiner*—Krista Soderholm
(74) *Attorney, Agent, or Firm*—Stetina Brunda Garred & Brucker

(57) ABSTRACT

A semiconductor package comprising a substrate having opposed top and bottom surfaces and a conductive pattern formed thereon. Disposed on the top surface of the substrate is a semiconductor die which is electrically connected to the conductive pattern. Also disposed on the top surface of the substrate is a leadframe which is electrically connected to the conductive pattern as well. A package body encapsulates the semiconductor die and partially encapsulates the leadframe such that a portion of the leadframe is exposed in one exterior surface of the package body, thus allowing a second semiconductor package to be stacked upon and electrically connected to the semiconductor package.

20 Claims, 5 Drawing Sheets

U.S. PATENT DOCUMENTS

| | | |
|---|---|---|
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,796,164 A * | 8/1998 | McGraw et al. ............ 257/723 |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |

| | | | | | | |
|---|---|---|---|---|---|---|
| 5,977,615 | A | 11/1999 | Yamaguchi et al. | 6,307,272 | B1 | 10/2001 | Takahashi et al. |
| 5,977,630 | A | 11/1999 | Woodworth et al. | 6,309,909 | B1 | 10/2001 | Ohgiyama |
| 5,981,314 | A | 11/1999 | Glenn et al. | 6,316,822 | B1 | 11/2001 | Venkateshwaran et al. |
| 5,986,333 | A | 11/1999 | Nakamura | 6,316,838 | B1 | 11/2001 | Ozawa et al. |
| 5,986,885 | A | 11/1999 | Wyland | 6,323,550 | B1 | 11/2001 | Martin et al. |
| 6,001,671 | A | 12/1999 | Fjelstad | 6,326,243 | B1 | 12/2001 | Suzuya et al. |
| 6,013,947 | A | 1/2000 | Lim | 6,326,244 | B1 | 12/2001 | Brooks et al. |
| 6,018,189 | A | 1/2000 | Mizuno | 6,326,678 | B1 | 12/2001 | Karmezos et al. |
| 6,020,625 | A | 2/2000 | Qin et al. | 6,335,564 | B1 | 1/2002 | Pour |
| 6,025,640 | A | 2/2000 | Yagi et al. | 6,337,510 | B1 | 1/2002 | Chun-Jen et al. |
| 6,031,279 | A | 2/2000 | Lenz | 6,339,255 | B1 | 1/2002 | Shin |
| RE36,613 | E | 3/2000 | Ball | 6,348,726 | B1 | 2/2002 | Bayan et al. |
| 6,034,423 | A | 3/2000 | Mostafazadeh et al. | 6,355,502 | B1 | 3/2002 | Kang et al. |
| 6,040,626 | A | 3/2000 | Cheah et al. | 6,369,447 | B2 | 4/2002 | Mori |
| 6,043,430 | A | 3/2000 | Chun | 6,369,454 | B1 | 4/2002 | Chung |
| 6,060,768 | A | 5/2000 | Hayashida et al. | 6,373,127 | B1 | 4/2002 | Baudouin et al. |
| 6,060,769 | A | 5/2000 | Wark | 6,380,048 | B1 | 4/2002 | Boon et al. |
| 6,072,228 | A | 6/2000 | Hinkle et al. | 6,384,472 | B1 | 5/2002 | Huang |
| 6,075,284 | A | 6/2000 | Choi et al. | 6,388,336 | B1 | 5/2002 | Venkateshwaran et al. |
| 6,081,029 | A | 6/2000 | Yamaguchi | 6,395,578 | B1 | 5/2002 | Shin et al. |
| 6,084,310 | A | 7/2000 | Mizuno et al. | 6,400,004 | B1 | 6/2002 | Fan et al. |
| 6,087,715 | A | 7/2000 | Sawada et al. | 6,410,979 | B2 | 6/2002 | Abe |
| 6,087,722 | A | 7/2000 | Lee et al. | 6,414,385 | B1 | 7/2002 | Huang et al. |
| 6,100,594 | A | 8/2000 | Fukui et al. | 6,420,779 | B1 | 7/2002 | Sharma et al. |
| 6,113,474 | A | 9/2000 | Costantini et al. | 6,429,508 | B1 | 8/2002 | Gang |
| 6,114,752 | A | 9/2000 | Huang et al. | 6,437,429 | B1 | 8/2002 | Su et al. |
| 6,118,174 | A | 9/2000 | Kim | 6,444,499 | B1 | 9/2002 | Swiss et al. |
| 6,118,184 | A | 9/2000 | Ishio et al. | 6,448,633 | B1 | 9/2002 | Yee et al. |
| RE36,907 | E | 10/2000 | Templeton, Jr. et al. | 6,452,279 | B2 | 9/2002 | Shimoda |
| 6,130,115 | A | 10/2000 | Okumura et al. | 6,459,148 | B1 | 10/2002 | Chun-Jen et al. |
| 6,130,473 | A | 10/2000 | Mostafazadeh et al. | 6,464,121 | B2 | 10/2002 | Reijnders |
| 6,133,623 | A | 10/2000 | Otsuki et al. | 6,476,469 | B2 | 11/2002 | Huang et al. |
| 6,140,154 | A | 10/2000 | Hinkle et al. | 6,476,474 | B1 | 11/2002 | Hung |
| 6,143,981 | A | 11/2000 | Glenn | 6,482,680 | B1 | 11/2002 | Khor et al. |
| 6,169,329 | B1 | 1/2001 | Farnworth et al. | 6,498,099 | B1 | 12/2002 | McLellan et al. |
| 6,177,718 | B1 | 1/2001 | Kozono | 6,498,392 | B2 | 12/2002 | Azuma |
| 6,181,002 | B1 | 1/2001 | Juso et al. | 6,507,096 | B2 | 1/2003 | Gang |
| 6,184,465 | B1 | 2/2001 | Corisis | 6,507,120 | B2 | 1/2003 | Lo et al. |
| 6,184,573 | B1 | 2/2001 | Pu | 6,534,849 | B1 | 3/2003 | Gang |
| 6,190,944 | B1* | 2/2001 | Choi ......................... 438/109 | 6,545,332 | B2 | 4/2003 | Huang |
| 6,194,777 | B1 | 2/2001 | Abbott et al. | 6,545,345 | B1 | 4/2003 | Glenn et al. |
| 6,197,615 | B1 | 3/2001 | Song et al. | 6,559,525 | B2 | 5/2003 | Huang |
| 6,198,171 | B1 | 3/2001 | Huang et al. | 6,566,168 | B2 | 5/2003 | Gang |
| 6,201,186 | B1 | 3/2001 | Daniels et al. | 6,583,503 | B2 | 6/2003 | Akram et al. |
| 6,201,292 | B1 | 3/2001 | Yagi et al. | 6,603,196 | B2 | 8/2003 | Lee et al. |
| 6,204,554 | B1 | 3/2001 | Ewer et al. | 6,624,005 | B1 | 9/2003 | DiCaprio et al. |
| 6,208,020 | B1 | 3/2001 | Minamio et al. | 6,667,546 | B2 | 12/2003 | Huang et al. |
| 6,208,021 | B1 | 3/2001 | Ohuchi et al. | 2001/0008305 | A1 | 7/2001 | McLellan et al. |
| 6,208,023 | B1 | 3/2001 | Nakayama et al. | 2001/0014538 | A1 | 8/2001 | Kwan et al. |
| 6,211,462 | B1 | 4/2001 | Carter, Jr. et al. | 2002/0011654 | A1 | 1/2002 | Kimura |
| 6,218,731 | B1 | 4/2001 | Huang et al. | 2002/0024122 | A1 | 2/2002 | Jung et al. |
| 6,222,258 | B1 | 4/2001 | Asano et al. | 2002/0027297 | A1 | 3/2002 | Ikenaga et al. |
| 6,222,259 | B1 | 4/2001 | Park et al. | 2002/0140061 | A1 | 10/2002 | Lee |
| 6,225,146 | B1 | 5/2001 | Yamaguchi et al. | 2002/0140068 | A1 | 10/2002 | Lee et al. |
| 6,229,200 | B1 | 5/2001 | Mclellan et al. | 2002/0163015 | A1 | 11/2002 | Lee et al. |
| 6,229,205 | B1 | 5/2001 | Jeong et al. | 2003/0030131 | A1 | 2/2003 | Lee et al. |
| 6,239,367 | B1 | 5/2001 | Hsuan et al. | 2003/0073265 | A1 | 4/2003 | Hu et al. |
| 6,239,384 | B1 | 5/2001 | Smith et al. | 2004/0056277 | A1 | 3/2004 | Karnezos |
| 6,242,281 | B1 | 6/2001 | Mclellan et al. | 2004/0061212 | A1 | 4/2004 | Karnezos |
| 6,256,200 | B1 | 7/2001 | Lam et al. | 2004/0061213 | A1 | 4/2004 | Karnezos |
| 6,258,629 | B1 | 7/2001 | Niones et al. | 2004/0063242 | A1 | 4/2004 | Karnezos |
| 6,281,566 | B1 | 8/2001 | Magni | 2004/0063246 | A1 | 4/2004 | Karnezos |
| 6,281,568 | B1 | 8/2001 | Glenn et al. | 2004/0065963 | A1 | 4/2004 | Karnezos |
| 6,282,095 | B1 | 8/2001 | Houghton et al. | 2004/0183174 | A1* | 9/2004 | Huang et al. ................ 257/678 |
| 6,285,075 | B1 | 9/2001 | Combs et al. | 2005/0023670 | A1* | 2/2005 | Hata et al. .................. 257/690 |
| 6,291,271 | B1 | 9/2001 | Lee et al. | | | | |
| 6,291,273 | B1 | 9/2001 | Miyaki et al. | | | | |
| 6,294,100 | B1 | 9/2001 | Fan et al. | | | FOREIGN PATENT DOCUMENTS | |
| 6,294,830 | B1 | 9/2001 | Fjelstad | | | | |
| 6,295,977 | B1 | 10/2001 | Ripper et al. | EP | | 5421117 | 6/1979 |
| 6,297,548 | B1 | 10/2001 | Moden et al. | EP | | 5950939 | 3/1984 |
| 6,303,984 | B1 | 10/2001 | Corisis | EP | | 0393997 | 10/1990 |
| 6,303,997 | B1 | 10/2001 | Lee | EP | | 0459493 | 12/1991 |
| | | | | EP | | 0720225 | 3/1996 |

| | | | | | | |
|---|---|---|---|---|---|---|
| EP | 0720234 | 3/1996 | | JP | 5129473 | 5/1993 |
| EP | 0794572 A2 | 10/1997 | | JP | 5166992 | 7/1993 |
| EP | 0844665 | 5/1998 | | JP | 5283460 | 10/1993 |
| EP | 0936671 | 8/1999 | | JP | 692076 | 4/1994 |
| EP | 098968 | 3/2000 | | JP | 6140563 | 5/1994 |
| EP | 1032037 | 8/2000 | | JP | 6260532 | 9/1994 |
| JP | 55163868 | 12/1980 | | JP | 7297344 | 11/1995 |
| JP | 5745959 | 3/1982 | | JP | 7312405 | 11/1995 |
| JP | 58160095 | 8/1983 | | JP | 864634 | 3/1996 |
| JP | 59208756 | 11/1984 | | JP | 8083877 | 3/1996 |
| JP | 59227143 | 12/1984 | | JP | 8125066 | 5/1996 |
| JP | 60010756 | 1/1985 | | JP | 8222682 | 8/1996 |
| JP | 60116239 | 8/1985 | | JP | 8306853 | 11/1996 |
| JP | 60195957 | 10/1985 | | JP | 98205 | 1/1997 |
| JP | 60231349 | 11/1985 | | JP | 98206 | 1/1997 |
| JP | 6139555 | 2/1986 | | JP | 98207 | 1/1997 |
| JP | 629639 | 1/1987 | | JP | 992775 | 4/1997 |
| JP | 6333854 | 2/1988 | | JP | 9293822 | 11/1997 |
| JP | 63067762 | 3/1988 | | JP | 10022447 | 1/1998 |
| JP | 63188964 | 8/1988 | | JP | 10163401 | 6/1998 |
| JP | 63205935 | 8/1988 | | JP | 10199934 | 7/1998 |
| JP | 63233555 | 9/1988 | | JP | 10256240 | 9/1998 |
| JP | 63249345 | 10/1988 | | JP | 00150765 | 5/2000 |
| JP | 63289951 | 11/1988 | | JP | 556398 | 10/2000 |
| JP | 63316470 | 12/1988 | | JP | 2001060648 | 3/2001 |
| JP | 64054749 | 3/1989 | | JP | 200204397 | 8/2002 |
| JP | 1106456 | 4/1989 | | KR | 941979 | 1/1994 |
| JP | 1175250 | 7/1989 | | KR | 9772358 | 11/1997 |
| JP | 1205544 | 8/1989 | | KR | 100220154 | 6/1999 |
| JP | 1251747 | 10/1989 | | KR | 0049944 | 6/2002 |
| JP | 2129948 | 5/1990 | | WO | 9956316 | 11/1999 |
| JP | 369248 | 7/1991 | | WO | 9967821 | 12/1999 |
| JP | 3177060 | 8/1991 | | | | |
| JP | 4098864 | 9/1992 | | | | |

\* cited by examiner

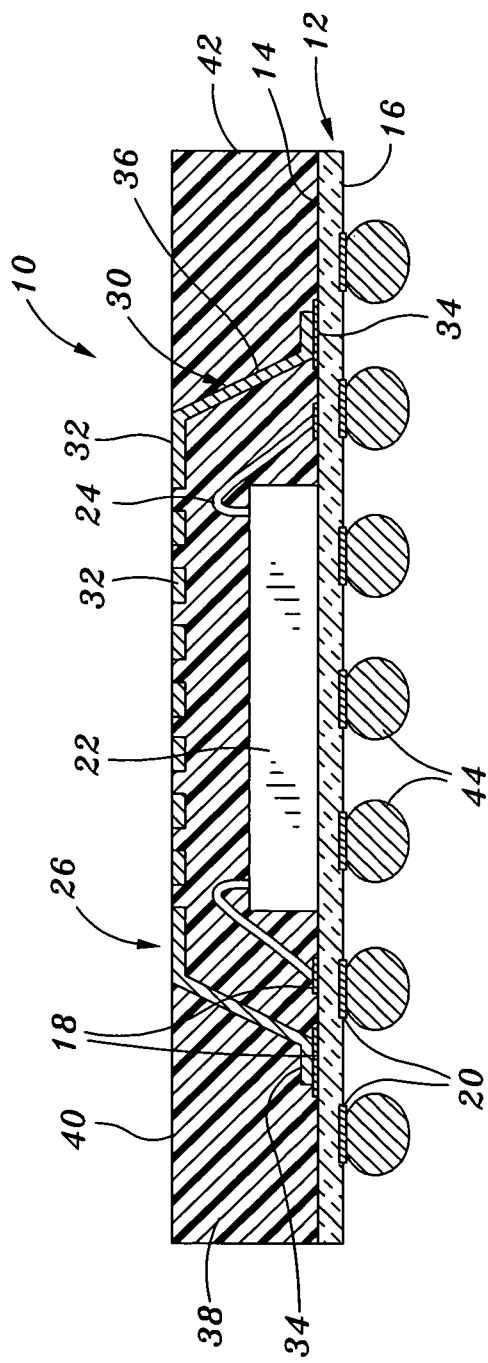
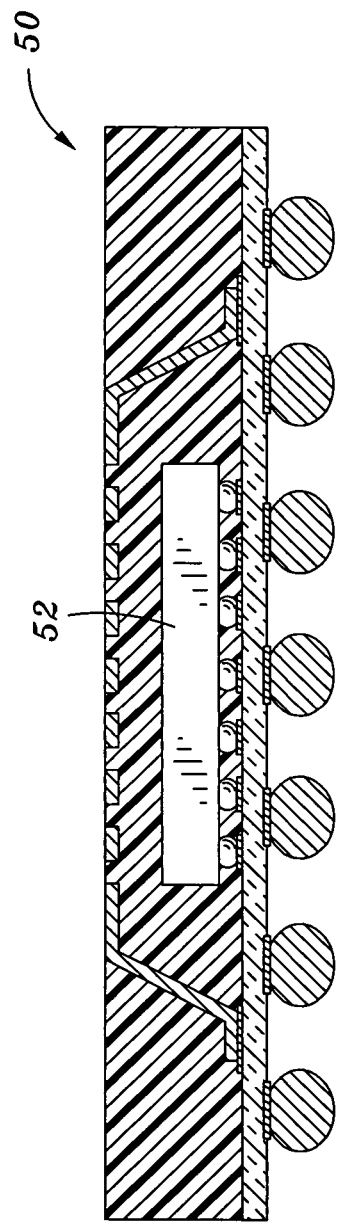
Fig.1
Fig.2

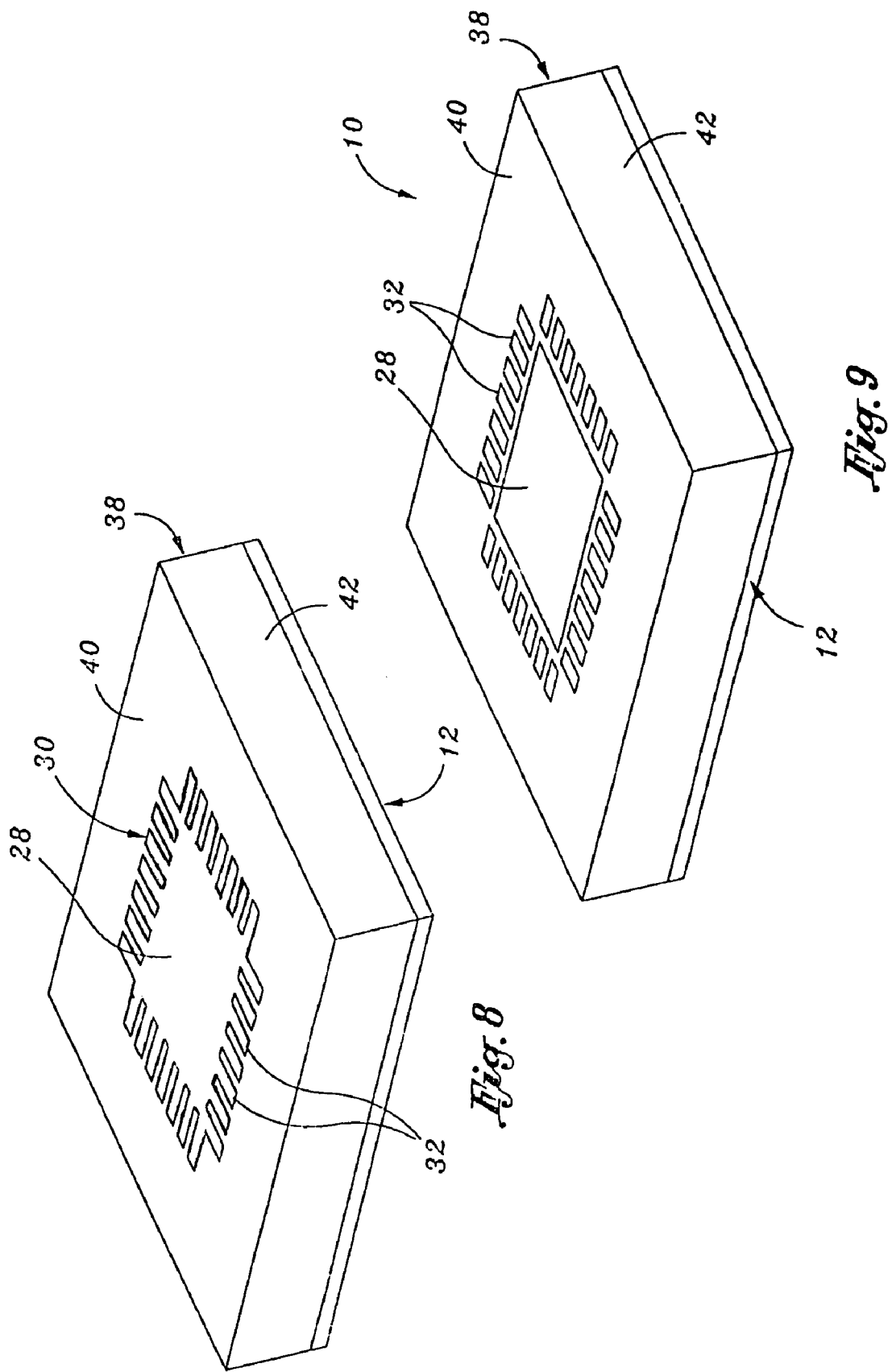

US 7,190,062 B1

EMBEDDED LEADFRAME SEMICONDUCTOR PACKAGE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

The present invention relates generally to integrated circuit packaging and, more particularly, to a ball grid array (BGA) or lan grid array (LGA) semiconductor package including an embedded leadframe for allowing the vertical stacking of an LGA or leadframe package thereupon.

A staple component of the electronics industry is a ball grid array (BGA) semiconductor package. BGA packages typically comprise a substrate having a plurality of array-arranged solder balls on the bottom surface thereof. The solder balls act as I/O (input/output) connections for a semiconductor die which is attached to the opposite, top surface of the substrate. In this regard, the substrate is typically provided with a conductive pattern (e.g., pads, traces, vias, etc.), with the semiconductor die being electrically connected to the conductive pattern which is used to route signals from the semiconductor die to the solder balls. The semiconductor die is typically covered by a hardened encapsulant which also covers the top surface of the substrate and defines the package body of the BGA package. Thus, the solder balls deposited on the bottom surface of the substrate are used to electrically connect the semiconductor die to an external device, e.g., a printed circuit board (PCB). The conductive pattern of the substrate may be configured so as to facilitate the electrical connection of the semiconductor die to differently functioned solder balls to allow the BGA package to operate with multiple functions of grounding, powering, and signaling.

One of the notable drawbacks of currently known BGA packages is the absence therein of any elements which allow for the stacking of a second semiconductor package thereon. The increased signal processing and memory requirements of many electronic devices, coupled with the need to occupy a minimal amount of space within such devices, makes it highly desirable for BGA or LGA packages to be configured to allow for the stacking of a second semiconductor package thereupon. The present invention addresses this deficiency by providing a BGA package with an embedded leadframe which allows for the stacking of a second semiconductor package such as an LGA or leadframe package on top of the package. These, as well as other features and advantages of the present invention, will be described in more detail below.

BRIEF SUMMARY OF THE INVENTION

In accordance with the present invention, there is provided a BGA or LGA semiconductor package which includes an embedded leadframe to enable the stacking of a second semiconductor package such as an LGA or leadframe package to the top of the package. In the present package, a leadframe is surface mounted to conductive pads on the top surface of the laminate substrate of the package. The conductive pads comprise part of the conductive pattern of the substrate, which also includes conductive pads on the bottom surface thereof, as well as conductive traces and/or vias extending along and/through the substrate. Also mounted to the top surface of the substrate is a semiconductor die which is itself electrically connected to the conductive pattern. In one embodiment of the present invention, the package may include a semiconductor die which is electrically connected to the conductive pattern of the substrate through the use of conductive wires. In an alternative embodiment of the present invention, the package may include a flip-chip semiconductor die which is electrically connected to the conductive pattern of the substrate through the use of conductive contacts or balls as opposed to wires.

After both the leadframe and the semiconductor die have been mounted to the substrate and electrically connected to the conductive pattern thereof, a molding operation is completed wherein a mold cap or package body is formed to fully cover or encapsulate the semiconductor die and conductive wires (if any), and partially cover or encapsulate the leadframe. Subsequent to the completion of the overmold, a deflashing process is completed to fully expose portions of the leads of the leadframe upon the top surface of the package body. Thereafter, the exposed portions of the leads may optionally be plated with a layer of a suitable conductive material. An etching or sawing process is then completed to effectively electrically isolate the leads of the leadframe from each other. The exposed portions of the leads of the leadframe (which define pads or terminals) provide a footprint to which a second semiconductor package may be electrically connected, and thus stacked upon the package.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIG. 1 is a cross-sectional view of a semiconductor package constructed in accordance with a first embodiment of the present invention;

FIG. 2 is a cross-sectional view of a semiconductor package constructed in accordance with a second embodiment of the present invention;

FIGS. 4–9 illustrate an exemplary sequence of steps which may be used to facilitate the fabrication of the semiconductor package constructed in accordance with the first embodiment of the present invention shown in FIG. 1.

Common reference numerals are used throughout the drawings and detailed description to indicate like elements.

DETAILED DESCRIPTION OF THE INVENTION

Figure 3:
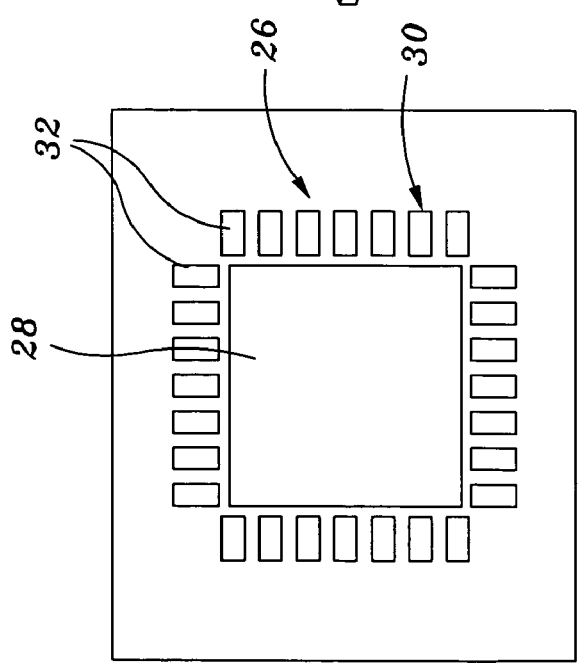
FIG. 3 is a top plan view of the semiconductor package constructed in accordance with either the first or second embodiments of the present invention as shown in FIGS. 1 and 2.

Referring now to the drawings wherein the showings are for purposes of illustrating preferred embodiments of the present invention only, and not for purposes of limiting the same, FIG. 1 illustrates an embedded leadframe BGA or LGA semiconductor package 10 constructed in accordance with a first embodiment of the present invention. FIG. 3 provides a top plan view of the completed package 10 of the first embodiment.

The package 10 includes a laminate substrate 12 which has a generally quadrangular (e.g., square, rectangular) configuration. The substrate 12 defines a generally planar top surface 14 and an opposed, generally planar bottom surface 16. The substrate 12 is formed to include a conductive pattern. The conductive pattern itself comprises a plurality of conductive pads 18 of a first set which are disposed on the top surface 14 in a prescribed pattern or array, and a plurality of conductive pads 20 of a second set which are disposed on the bottom surface 16 in a prescribed pattern or array. In addition to the pads 18, 20 of the first and second sets, the conductive pattern further includes conductive traces and/or vias which extend along and/or through the substrate 12, and are arranged so as to place at least some of the conductive pads 18 of the first set into electrical communication with at least one of the conductive pads 20 of the second set. It will be recognized that one or more pads 18 of the first set may be electrically isolated from the pads 20 of the second set, and used solely for communicating with a semiconductor package which is stacked upon the package 10.

The package 10 of the first embodiment further comprises a semiconductor die 22, the bottom surface of which is directly mounted to the top surface 14 of the substrate 12. Such attachment may be facilitated through the use of a suitable epoxy or adhesive. The terminals of the semiconductor die 22 are electrically connected to respective ones of the pads 18 of the first set through the use of conductive wires 24.

As further seen in FIG. 1, the package 10 of the first embodiment also includes a leadframe 26. The leadframe 26 itself comprises a central support plate 28 (shown in FIG. 3) which has a generally quadrangular (e.g., square) configuration. In addition to the support plate 28, the leadframe 28 comprises a plurality of elongate leads 30 which are arranged about the support plate 28 in spaced relation to the peripheral edge thereof. In the leadframe 26, each of the leads 30 has a bent configuration so as to define an upper terminal portion 32 and a lower mounting portion 34. As best seen in FIG. 1, the terminal and mounting portions 32, 34 of each lead 30 extend angularly relative to a central portion 36 thereof. In the package 10, the leadframe 26 is electrically connected to the conductive pattern of the substrate 12 by placing the mounting portions 34 of the leads 30 into direct, conductive contact with respective ones of the pads 18 of the first set. Due to the bent configuration of each of the leads 30, the electrical connection of the mounting portions 34 to the pads 18 results in the terminal portions 32 of the leads 30 being elevated substantially above the top surface 14 of the substrate 12, and extending in generally parallel relation thereto. The support plate 28 of the leadframe 26 is also elevated above and extends in generally parallel relation to the top surface 14, for reasons which will be described in more detail below. As best seen in FIG. 3, the configuration of the leadframe 26 is such that the terminal portions 32 thereof are arranged in a generally quadrangular pattern when the leadframe 26 is electrically connected to the conductive pattern of the substrate 12 in the above-described manner. In addition to the terminal portions 32 of the leads 30 being spaced from each other, they also extend along and in spaced relation to a respective one of the four peripheral edge segments defined by the quadrangular support plate 28 of the leadframe 26.

The package 10 of the first embodiment further comprises a package body 38 which is formed on the top surface 14 of the substrate 12. The package body 38 is fabricated from an encapsulant material. The encapsulant material is preferably a plastic (e.g., thermoset, thermoplastic) which, upon hardening, forms the package body 38. Such formation is itself preferably completed through the implementation of a molding process. The fully formed package body 38 defines a generally planar top surface 40 and a generally planar side surface 42 which extends generally perpendicularly from the top surface 40 is substantially flush or continuous with the peripheral edge of the substrate 12. As indicated above, the bottom surface of the package body 38 rests directly against the top surface 14 of the substrate 12. However, it is contemplated that the package body 38 may be formed so as not to extend all the way to the peripheral edge of the substrate 12.

In the package 10, the package body 38 is formed such that both the semiconductor die 22 and conductive wires 24 used to electrically connect the semiconductor die 22 to the conductive pattern of the substrate 12 are fully covered or encapsulated by the package body 38. The leadframe 26 of the package 10 is itself partially covered or encapsulated by the package body 38. In this regard, though both the mounting and central portions 34, 36 of each lead 30 of the leadframe 26 are covered by the package body 38, the terminal portion 32 of each lead 30 is partially exposed therein. More particularly, one surface of each terminal portion 32 is exposed in and substantially flush with the top surface 40 of the package body 38. Those of ordinary skill in the art will recognize that as an alternative to one surface of each terminal portion 32 being exposed in and substantially flush with the top surface 40 of the package body 38, each terminal portion 32 may slightly protrude from the top surface 40.

As further seen in FIG. 3 and in FIG. 9, also exposed in the package body 38 is one surface of the support plate 28 of the leadframe 26. More particularly, one surface of the support plate 28 is exposed in and substantially flush with the top surface 40 of the package body 38, in the same manner one surface of each terminal portion 32 is exposed in and substantially flush with the top surface 40. Thus, the exposed surfaces of the terminal portions 32 and the support plate 28 preferably extend in generally co-planar relation to each other. However, as described above in relation to the terminal portions 32, the support plate 28 may protrude slightly from the top surface 40 of the package body 38. As seen in FIG. 3 and as described above, the exposed surfaces of the terminal portions 32, in addition to being spaced from each other, also extend along and in spaced relation to a respective ones of the four peripheral edge segments defined by the exposed surface of the support plate 28. The leaframe 26 is preferably fabricated from a conductive metal material, such as copper.

The package 10 of the first embodiment further comprises a plurality of solder balls 44 which are formed on and conductively connected to respective ones of the pads 20 of the second set in the manner shown in FIG. 1. The solder balls 44 are used to electrically connect the package 10 to an external device such as a printed circuit board (PCB).

Figure 10:
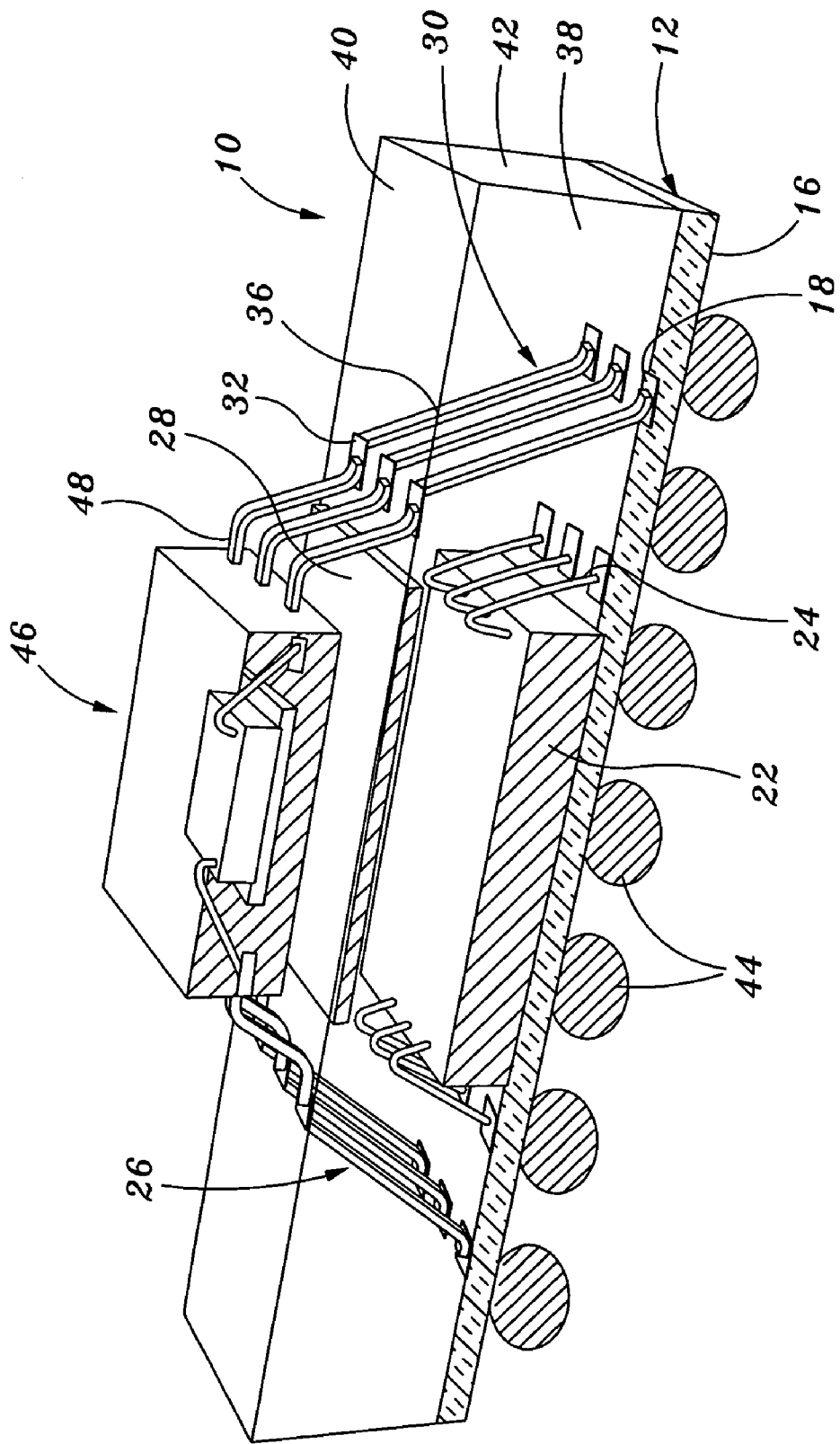
FIG. 10 is a partial cross-sectional view illustrating the manner in which a second semiconductor package is stacked upon the semiconductor package constructed in accordance with the first embodiment of the present invention.

Referring now to FIG. 10, in the completed package 10, the exposed surfaces of the terminals 32 of the leads 30 of the leadframe 26 define a "footprint" which allows for the stacking of a second semiconductor package 46 upon the package 10, and electrical connection of the second semiconductor package 46 to the package 10. In this regard, such electrical connection is preferably facilitated by placing the leads 48 of the second semiconductor package 46 into electrical connection to respective ones of the exposed surfaces of the terminal portions 32 of the leadframe 26 of the package body 10.

Figure 4:
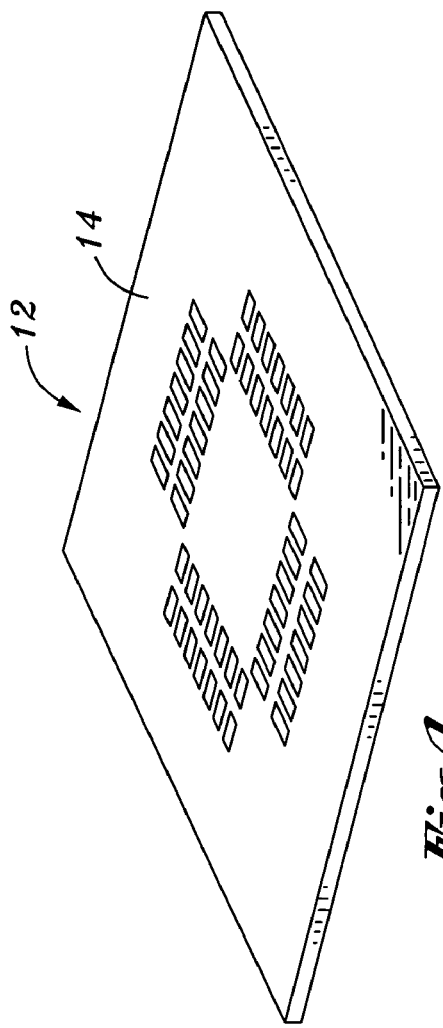

Having thus described the structural attributes of the package 10 of the first embodiment, an exemplary method of fabricating the same will now be described with regard to FIGS. 4–9. In the initial step of the fabrication methodology, the substrate 12 is provided (FIG. 4). As indicated above, the substrate 12, as fabricated, includes the above-described conductive pattern which comprises the conductive pads 18, 20 of the first and second sets and the intervening traces and/or vias.

Figure 5:
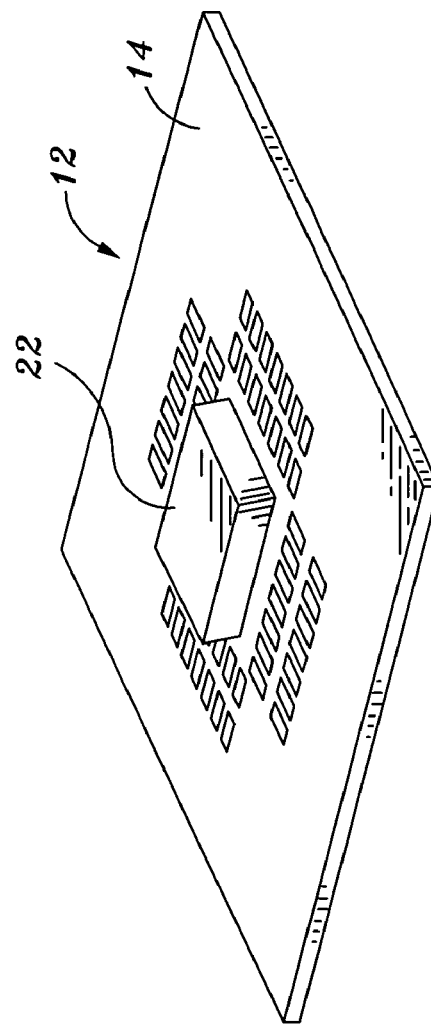
Figure 6:
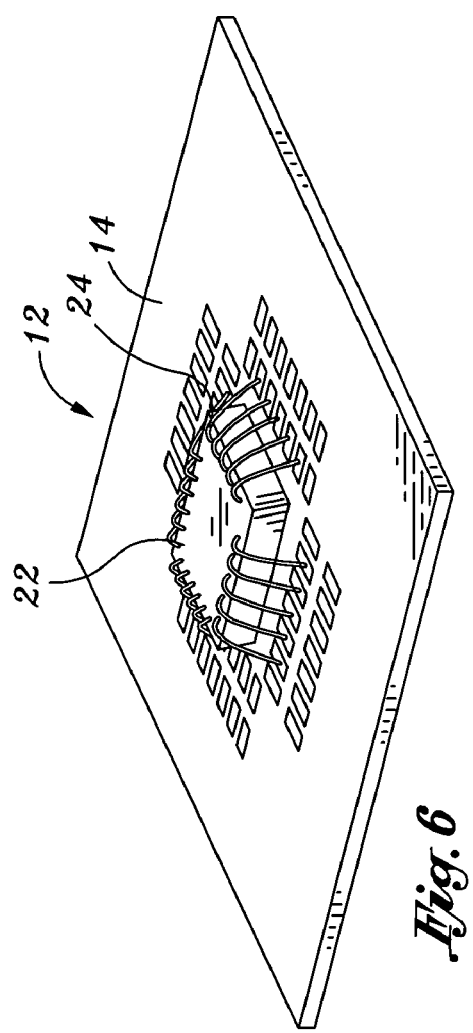
Figure 7:
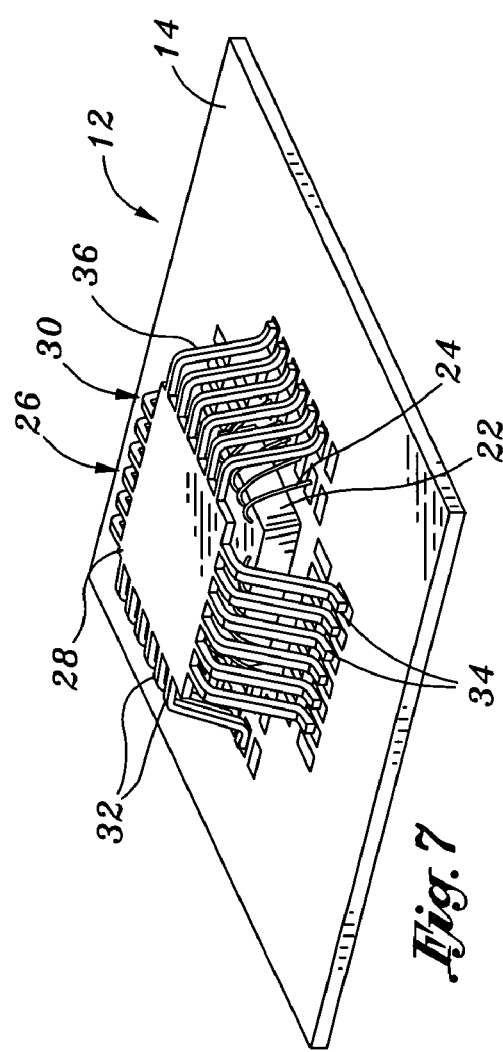

In the next step of the fabrication process, the semiconductor die 22 is attached to the top surface 14 of the substrate 12 in the above-described manner (FIG. 5). Thereafter, the terminals disposed on the top surface of the semiconductor die 22 are electrically connected to respective ones of the pads 18 of the first set through the use of the conductive wires 24 (FIG. 6). Subsequent to the electrical connection of the semiconductor die 22 to the conductive pattern of the substrate 12 through the use of the conductive wires 24, the leadframe 26 is itself electrically connected to the conductive pattern of the substrate 12 in the above-described manner (FIG. 7). More particularly, the mounting portions 34 of the leads 30 of the leadframe 26 are electrically connected to respective ones of the pads 18 of the first set. As is noted in FIG. 7, when the leadframe 26 is initially electrically connected to the substrate 12, each of the leads 30 is integrally connected to the support plate 28. In this regard, the leads 30 are segregated into four sets, with the terminal portions 32 of the leads 30 of each set being integrally connected to a respective one of the four peripheral edge segments defined by the support plate 28. When the leadframe 26 is in its original state (not shown), the leads 30 are not bent, and thus extend generally perpendicularly from respective ones of the peripheral edge segments of the support plate 28. In this regard, the bending of the leads 30 to cause the same to assume the above-described shape typically occurs subsequent to the initial formation of the support plate 28 and leads 30. When the leadframe 26 is attached to the substrate 12 in the above-described manner, the semiconductor die 22 resides between the substrate 12 and the support plate 28 of the leadframe 26.

Subsequent to the electrical connection of the leadframe 26 to the substrate 12, a molding process is completed to facilitate the formation of the package body 38 (FIG. 8). As described above, the package body 38 is preferably formed such that one surface of the support plate 28 and one surface of the terminal portion 32 of each of the leads 30 is exposed in and substantially flush with top surface 40 of the package body 38. Typically, in order to facilitate the exposure of such surfaces of the support plate 28 and terminal portions 32, a de-flashing process is completed subsequent to the initial formation of the package body 38. Upon the completion of such de-flashing process, the exposed surfaces of the terminal portions 32 of the leads 30 may optionally be plated with a layer of a suitable conductive material.

In the final step of the fabrication method for the semiconductor package 10, a singulation process is completed to effectively electrically isolate the terminal portions 32 of the leads 30 from the support plates 28 and each other (FIG. 9). Such singulation may be completed through either a chemical etching, sawing, or laser singulation process. In the sawing process, a pattern of cuts is made within the top surface 40 of the package body as needed to completely sever the terminal portions 32 of the leads 30 from the support plate 28. Similarly, in the etching process, the exposed surfaces of the leadframe 26 are initially masked such that the chemical etchant thereafter applied thereto removes only enough metal of the leadframe 26 as is necessary to completely sever the terminal portions 32 of the leads 30 from the support plate 28. The completion of the sawing or etching process described above completes the fabrication of the package 10.

Referring now to FIG. 2, there is shown an embedded leadframe package 50 constructed in accordance with a second embodiment of the present invention. The package 50 is substantially similar in construction to the package 10 of the first embodiment, the primary distinction being that the package 50 includes a flip-chip semiconductor die 52 as an alternative to the semiconductor die 22 described above in relation to the package 10. In this regard, the contacts or terminals 54 of the flip-chip semiconductor die 52 are electrically connected to respective ones of the pads 18 of the first set. As will be recognized, the number of pads 18 of the first set included on the substrate 12 used in the package 50 may exceed the number of pads 18 included on the substrate 12 used in the package 10. In this regard, the increased number of pads 18 in the package 50 may be needed to accommodate the terminals 54 of the flip-chip semiconductor die 52. Thus, the package 50 avoids the use of the above-described conductive wires 24 due to the electrical connection between the flip-chip semiconductor die 52 and conductive pattern of the substrate 12 being facilitated by the contact between the terminals 54 and the pads 18. The fabrication methodology employed for the package 50 is also substantially similar to that described above in relation to the package 10, the distinction lying in the manner in which the flip-chip semiconductor die 52 is electrically connected to the substrate 12 in comparison to the manner in which the semiconductor die 22 is electrically connected to the substrate 12.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
   a substrate having opposed top and bottom surfaces and a conductive pattern formed thereon;
   a semiconductor die disposed on the top surface of the substrate and electrically connected to the conductive pattern;
   a leadframe disposed on the top surface of the substrate, the leadframe comprising a support plate and a plurality of leads arranged about the support plate, the leads being electrically isolated from the support plate and each other; and
   a package body encapsulating the semiconductor die and partially encapsulating the leadframe such that portions of the leadframe are exposed in a common surface of the package body.

2. The semiconductor package of claim 1 wherein the leads are electrically connected to the conductive pattern.

3. The semiconductor package of claim 1 wherein each of the leads of the leadframe includes:
   a central portion;

a mounting portion extending angularly from one end of the central portion; and a terminal portion extending angularly from one end of the central portion;

the mounting portion of each of the leads being electrically connected to the conductive pattern of the substrate, with the terminal portion of each of the leads being partially exposed in the package body.

4. The semiconductor package of claim 3 wherein:

the package body defines a generally planar top surface; and the terminal portion of each of the leads defines a terminal surface which is exposed in and substantially flush with the top surface of the package body.

5. The semiconductor package of claim 4 wherein the support plate of the leadframe defines a generally planar plate surface which is exposed in and substantially flush with the top surface of the package body.

6. The semiconductor package of claim 3 wherein the conductive pattern of the substrate comprises:

a first set of conductive pads disposed on the top surface of the substrate; and a second set of conductive pads disposed on the bottom surface of the substrate, at least some of the pads of the first set being electrically connected to at least one of the pads of the second set;

the mounting portions of the leads of the leadframe being electrically connected to respective ones of the pads of the first set.

7. The semiconductor package of claim 6 wherein the semiconductor die is electrically connected to the conductive pattern through the use of conductive wires which extend from the semiconductor die to respective ones of the pads of the first set.

8. The semiconductor package of claim 6 wherein the semiconductor die is a flip-chip semiconductor die having a plurality of contacts which are electrically connected to respective ones of the pads of the first set.

9. The semiconductor package of claim 6 further comprising a plurality of solder balls formed on respective ones of the pads of the second set.

10. The semiconductor package of claim 1 wherein the semiconductor die is electrically connected to the conductive pattern through the use of conductive wires.

11. The semiconductor package of claim 1 further in combination with a second semiconductor package electrically connected to the exposed portions of the leadframe.

12. A semiconductor package, comprising:

a substrate having opposed top and bottom surfaces and a conductive pattern formed thereon;

a semiconductor die disposed on the top surface of the substrate and electrically connected to the conductive pattern;

a package body formed on the substrate and encapsulating the semiconductor die; and a plurality of leads partially embedded in the package body and electrically connected to the conductive pattern, each of the leads including a terminal portion which is partially exposed in the package body for allowing a second semiconductor package to be stacked upon and electrically connected to the semiconductor package.

13. A semiconductor package, comprising:

a substrate having opposed top and bottom surfaces and a conductive pattern formed thereon;

a semiconductor die disposed on the top surface of the substrate and electrically connected to the conductive pattern;

a leadframe disposed on the top surface of the substrate and having a plurality of leads which are isolated from each other and electrically connected to the conductive pattern; and a package body encapsulating the semiconductor die and partially encapsulating the leadframe such that a portion of each of the leads of the leadframe is exposed in a common surface of the package body.

14. The semiconductor package of claim 13 wherein each of the leads of the leadframe includes:

a central portion;

a mounting portion extending from one end of the central portion; and a terminal portion extending angularly from one end of the central portion;

the mounting portion of each of the leads being electrically connected to the conductive pattern of the substrate, with the terminal portion of each of the leads being partially exposed in package body.

15. The semiconductor package of claim 14 wherein:

the package body defines a generally planar top surface; and the terminal portion of each of the leads defines a terminal surface which is exposed in and substantially flush with the top surface of the package body.

16. The semiconductor package of claim 14 wherein the conductive pattern of the substrate comprises:

a first set of conductive pads disposed on the top surface of the substrate; and a second set of conductive pads disposed on the bottom surface of the substrate, each of the pads of the first set being electrically connected to at least one of the pads of the second set;

the mounting portions of the leads of the leadframe being electrically connected to respective ones of the pads of the first set.

17. The semiconductor package of claim 16 wherein the semiconductor die is electrically connected to the conductive pattern through the use of conductive wires which extend from the semiconductor die to respective ones of the pads of the first set.

18. The semiconductor package of claim 16 wherein the semiconductor die is a flip-chip semiconductor die having a plurality of contacts which are electrically connected to respective ones of the pads of the first set.

19. The semiconductor package of claim 16 further comprising a plurality of solder balls formed on respective ones of the pads of the second set.

20. The semiconductor package of claim 13 wherein the semiconductor die is electrically connected to the conductive pattern through the use of conductive wires.

* * * * *